US012607932B2

(12) United States Patent
Su et al.

(10) Patent No.: US 12,607,932 B2
(45) Date of Patent: Apr. 21, 2026

(54) PHOTOSENSITIVE COMPOSITION AND FILM PREPARED FROM THE SAME

(71) Applicant: INDUSTRIAL TECHNOLOGY RESEARCH INSTITUTE, Hsinchu (TW)

(72) Inventors: Yu-Yang Su, New Taipei (TW); Chih-Jen Yang, Taoyuan (TW); Yung-Lung Tseng, Zhubei (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 278 days.

(21) Appl. No.: 18/189,546

(22) Filed: Mar. 24, 2023

(65) Prior Publication Data

US 2023/0229080 A1 Jul. 20, 2023

Related U.S. Application Data

(63) Continuation-in-part of application No. 17/564,997, filed on Dec. 29, 2021.

(60) Provisional application No. 63/166,343, filed on Mar. 26, 2021.

(30) Foreign Application Priority Data

Dec. 6, 2021 (TW) ................................ 110145399
Mar. 25, 2022 (TW) ................................ 111111400

(51) Int. Cl.
*G03F 7/038* (2006.01)

(52) U.S. Cl.
CPC .................................. *G03F 7/038* (2013.01)

(58) Field of Classification Search
None
See application file for complete search history.

(56) References Cited

U.S. PATENT DOCUMENTS

| | | | |
|---|---|---|---|
| 6,031,068 A | 2/2000 | Okada | |
| 7,026,032 B2 | 4/2006 | Lee et al. | |
| 9,982,108 B2 | 5/2018 | Lin et al. | |
| 10,214,615 B2 | 2/2019 | Smits et al. | |
| 10,711,105 B2 | 7/2020 | Miyamoto et al. | |
| 10,743,418 B2 | 8/2020 | Huang | |
| 10,941,294 B2 | 3/2021 | Chiu et al. | |
| 2005/0096429 A1 | 5/2005 | Lee et al. | |
| 2007/0166535 A1* | 7/2007 | Lu | B32B 27/08 428/458 |
| 2013/0126860 A1 | 5/2013 | Fukuda et al. | |
| 2017/0009017 A1 | 1/2017 | Huang et al. | |
| 2017/0044321 A1 | 2/2017 | Inoue et al. | |
| 2017/0165879 A1 | 6/2017 | Miyamoto et al. | |
| 2018/0037698 A1 | 2/2018 | Miyamoto et al. | |
| 2019/0127529 A1 | 5/2019 | Liu et al. | |
| 2019/0169434 A1 | 6/2019 | Chiu et al. | |
| 2019/0191568 A1 | 6/2019 | Huang | |
| 2020/0255595 A1 | 8/2020 | Matsuyama et al. | |
| 2021/0087319 A1 | 3/2021 | Lee et al. | |
| 2021/0115251 A1 | 4/2021 | Chiu et al. | |
| 2021/0364919 A1 | 11/2021 | Huang et al. | |

FOREIGN PATENT DOCUMENTS

| | | | |
|---|---|---|---|
| CN | 106336511 | A | 1/2017 |
| CN | 108424516 | A | 8/2018 |
| CN | 110431483 | A | 11/2019 |
| CN | 112457492 | A | 3/2021 |
| CN | 112940316 | A | 6/2021 |
| CN | 113500834 | A | 10/2021 |
| JP | 2007-231125 | A | 9/2007 |
| JP | 5312071 | B2 | 10/2013 |
| JP | 2017-19986 | A | 1/2017 |
| JP | 2018-97378 | A | 6/2018 |
| JP | 2018-146969 | A | 9/2018 |
| JP | 2019-203136 | A | 11/2019 |
| JP | 6761588 | B2 | 9/2020 |
| JP | 2021-162834 | A | 10/2021 |
| JP | 2021-192086 | A | 12/2021 |
| TW | 201014877 | A | 4/2010 |
| TW | 201540745 | A | 11/2015 |
| TW | I572479 | B | 3/2017 |
| TW | I577715 | B | 4/2017 |
| TW | 202104434 | A | 2/2021 |

(Continued)

OTHER PUBLICATIONS

Attached is the Chinese Office Action and Search Report for Chinese Application No. 202111612689.X, dated May 27, 2023.
U.S. Office Action for U.S. Appl. No. 17/564,997, dated Dec. 2, 2024.
Japanese Office Action for Japanese Application No. 2023-046615, dated Feb. 27, 2024.
Araki et al., "Low Of Polyimide with Photosensitivity for High Frequency Applications", Journal of Photopolymer Science and Technology, vol. 33, No. 2, 2020, pp. 165-170.
Ju et al., "Characterizations of Copoly(ester imide)s with New 2,7-Dihydroxynaphthalene Bis(trimellitateanhydride)", Polymer (Korea), vol. 38, No. 5, 2014, pp. 632-639.

(Continued)

*Primary Examiner* — Randy P Gulakowski
*Assistant Examiner* — Audra J Destefano
(74) *Attorney, Agent, or Firm* — Birch, Stewart, Kolasch & Birch, LLP

(57) ABSTRACT

A photosensitive composition and film prepared from the same are provided. The photosensitive composition includes 100 parts by weight of polyimide, 0.25-50 parts by weight of initiator and 0.25-100 parts by weight of crosslinking agent. The polyimide is a product of a reactant (a) and a reactant (b) via a reaction. The reactant (a) consists of a first dianhydride and a second dianhydride. The molar ratio of the first dianhydride to the second dianhydride is 3:7 to 8:2. The reactant (b) includes a first diamine. The first dianhydride, the second dianhydride and the first diamine are disclosed in the specification.

9 Claims, No Drawings

(56) References Cited

FOREIGN PATENT DOCUMENTS

| | | | | | |
|---|---|---|---|---|---|
| TW | 202112901 | A | | 4/2021 | |
| WO | WO 2016/159102 | A1 | | 10/2016 | |
| WO | WO-2020150918 | A1 | * | 7/2020 | ............. C08G 69/44 |
| WO | WO 2021/085319 | A1 | | 5/2021 | |
| WO | WO 2022/202098 | A1 | | 9/2022 | |

OTHER PUBLICATIONS

Taiwanese Office Action and Search Report for corresponding Taiwanese Application No. 111111400, dated Feb. 24, 2023.
Japanese Office Action for Japanese Application No. 2021-214037, dated Mar. 14, 2023, with English translation.
Taiwanese Office Action and Search Report for Taiwanese Application No. 110145399, dated Sep. 28, 2022.
Chinese Office Action and Search Report for Chinese Application No. 202210306158.6, dated Mar. 31, 2025.

* cited by examiner

PHOTOSENSITIVE COMPOSITION AND FILM PREPARED FROM THE SAME

CROSS REFERENCE TO RELATED APPLICATIONS

This application claims priority of Taiwan Patent Application No. 111111400, filed on Mar. 25, 2022, the entirety of which is incorporated by reference herein. This application is a Continuation-In-Part of U.S. patent application Ser. No. 17/564,997, filed on Dec. 29, 2021, which claims priority of Taiwan Patent Application No. 110145399, filed on Dec. 6, 2021, and claims priority to U.S. Provisional Application Ser. No. 63/166,343, filed on Mar. 26, 2021, and, the entirety of which are incorporated by reference herein.

TECHNICAL FIELD

The disclosure relates to a photosensitive composition and a film prepared from the photosensitive composition.

BACKGROUND

Due to the excellent thermal stability and insulation properties of polyimide, it is often used as an insulating material and special engineering plastics. In addition, polyimide is widely used in flexible printed circuit boards (FPCs). With the development of mobile and personalized communication devices in recent years, demand for lightweight and thin, flexible printed circuit boards has incearsed sharply. With the incearsed functional integration of terminal application products, soft board technology must also be enhanced to meet certain incearsed requirements, such as high resolution, high response speed, and a large storage capacity. Therefore, the developmental trend in the design of flexible boards has been towards high frequency, high speed, and functionalization. Flexible boards used in high-frequency applications have become a trend in flexible board technology. The main focus of flexible boards used in high-frequency applications is that the substrate should exhibit a low dielectric coefficient and a low dielectric loss factor in order to match the enhancement and integration of the functions of mobile communication electronic devices.

The conventional photosensitive polyimide material is generally based on polyamic acid with photoreceptor and initiator. When the conventional photosensitive polyimide material is coated on substrate for exposure and development, it needs a high-temperature treatment (having a process temperature of about 250° C. to 350° C.) to force polyamic acid to form a film via ring-closing reaction. However, due to the high-temperature treatment, it is easy to cause stress between polyimide and substrate resulting from the difference in thermal expansion coefficient. This can cause the substrate to bend, deform or crack, and may even lead to delamination, resulting in damage to the device.

Accordingly, a polyimide composition with high-frequency dielectric properties, photosensitivity and low filming temperature is needed to solve the above problems.

SUMMARY

The disclosure provides a photosensitive composition, the photosensitive composition includes 100 parts by weight of polyimide, 0.25-50 parts by weight of initiator, and 0.25-100 parts by weight of crosslinking agent. According to embodiments of the disclosure, the polyimide of the disclosure is a product of a reactant (a) and a reactant (b) via a reaction, wherein the reactant (a) is a first dianhydride and a second dianhydride, wherein the molar ratio of the first dianhydride to the second dianhydride is 3:7 to 8:2, wherein the first dianhydride has a structure represented by Formula (I), and the second dianhydride has a structure represented by Formula (II)

Formula (I)

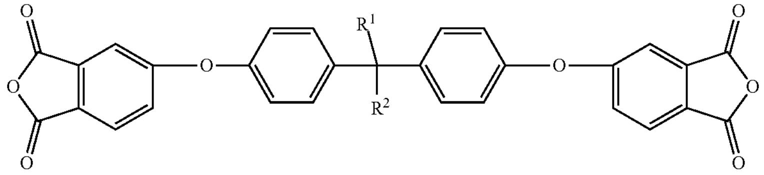

Formula (II)

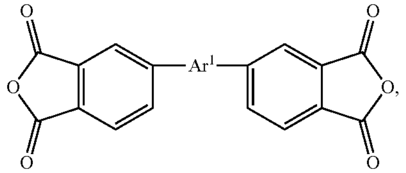

wherein $R^1$ and $R^2$ are independently hydrogen, fluorine, methyl, ethyl, propyl, fluoromethyl, fluoroethyl, or fluoropropyl; $Ar^1$ is

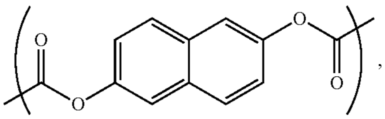

,

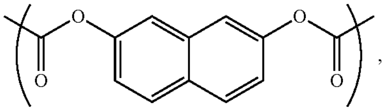

,

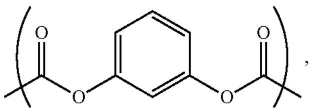

, or

-continued

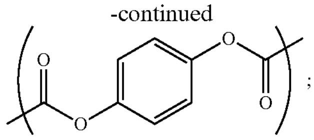

;

and, the reactant (b) includes a first diamine, wherein the first diamine is

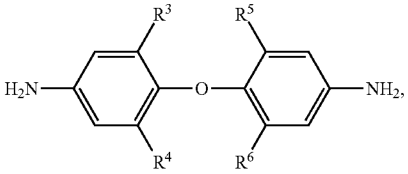

,

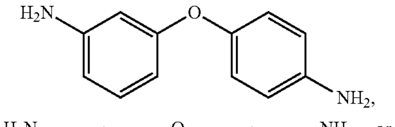

,

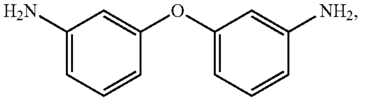

, or

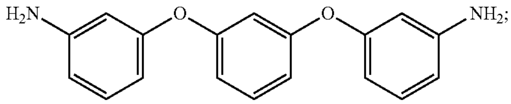

;

and, $R^3$, $R^4$, $R^5$ and $R^6$ are independently hydrogen, fluorine, methyl, ethyl, propyl, fluoromethyl, fluoroethyl, or fluoropropyl.

According to embodiments of the disclosure, the photosensitive composition may further include a solvent, and the photosensitive composition has a solid content of 20 wt % to 40 wt %.

According to embodiments of the disclosure, the disclosure also provides a film. The film can include a cured product of the photosensitive composition.

DETAILED DESCRIPTION OF DISCLOSED EMBODIMENTS

The photosensitive composition and film of the disclosure are described in detail in the following description. In the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent, however, that the exemplary embodiments set forth herein are used merely for the purpose of illustration, and the inventive concept may be embodied in various forms without being limited to those exemplary embodiments. As used herein, the term “about” in quantitative terms refers to plus or minus an amount that is general and reasonable to persons skilled in the art.

Furthermore, the use of ordinal terms such as “first”, “second”, “third”, etc., in the disclosure to modify an element does not by itself connote any priority, precedence, order of one claim element over another or the temporal order in which it is formed, but are used merely as labels to distinguish one claim element having a certain name from another element having the same name (but for use of the ordinal term) to distinguish the claim elements.

The disclosure provides a photosensitive composition and a film prepared from the photosensitive composition. According to embodiments of the disclosure, the photosensitive composition with patternablility and high resolution may be prepared by employing a specific polyimide with a photo-initiator and a crosslinking agent in a specific ratio. In the disclosure, the specific polyimide is prepared by reacting two specific dianhydrides (such as aryl-moiety-containing dianhydrides) with a specific diamine (such as aryl-moiety-containing diamine) in a specific molar ratio. As a result, by means of the specific ingredients and proportions, the photosensitive composition of the disclosure can be directly coated onto a copper foil, and the coating can be cured by irradiation at relative low temperature (i.e. the photosensitive composition has a lower filming temperature), thereby greatly improving the processability of the photosensitive composition. In addition, the cured product of the photosensitive composition of the disclosure exhibits low dielectric coefficient (Dk) and low dielectric loss factor (Df) at high frequencies (such as more than 10 GHz). Therefore, the photosensitive composition of the disclosure can be widely used as insulation material in electronic devices or as passivation film, buffer film, interlayer dielectric film and α-ray shielding film in semiconductor devices.

According to embodiments of the disclosure, the photosensitive composition of the disclosure can include polyimide, initiator (such as photo-initiator), and crosslinking agent. In the photosensitive composition, the amount of polyimide may be 100 parts by weight. In addition, the amount of initiator may be 0.25 to 50 parts by weight (such as 0.5 parts by weight, 1 parts by weight, 2 parts by weight, 3 parts by weight, 5 parts by weight, 8 parts by weight, 10 parts by weight, 15 parts by weight, 20 parts by weight, 25 parts by weight, 30 parts by weight, 35 parts by weight, 40 parts by weight, or 45 parts by weight), and the amount of crosslinking agent may be 0.25 to 100 parts by weight (such as 0.5 parts by weight, 1 parts by weight, 2 parts by weight, 3 parts by weight, 5 parts by weight, 8 parts by weight, 10 parts by weight, 15 parts by weight, 20 parts by weight, 25 parts by weight, 30 parts by weight, 35 parts by weight, 40 parts by weight, 45 parts by weight, 50 parts by weight, 55 parts by weight, 60 parts by weight, 65 parts by weight, 70 parts by weight, 75 parts by weight, 80 parts by weight, 85 parts by weight, 90 parts by weight, or 95 parts by weight).

According to embodiments of the disclosure, the polyimide of the disclosure may be a product of a reactant (a) and a reactant (b) via a reaction (such as polymerization). The reactant (a) may be at least one dianhydride (such as aryl-moiety-containing dianhydride). According to embodiments of the disclosure, the reactant (a) may consist of a first dianhydride and a second dianhydride. According to embodiments of the disclosure, the first dianhydride may have a structure represented by Formula (I), and the second dianhydride may have a structure represented by Formula (II)

Formula (I)

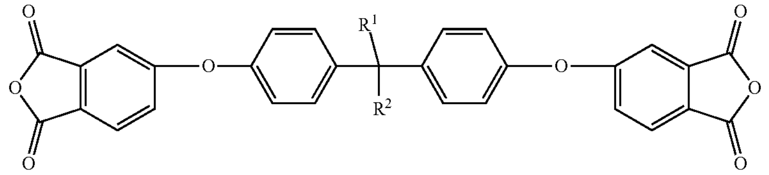

Formula (II)

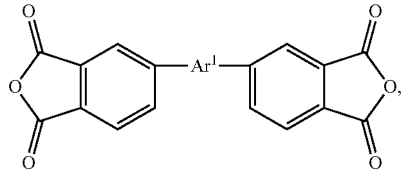

wherein $R^1$ and $R^2$ are independently hydrogen, fluorine, methyl, ethyl, propyl, fluoromethyl, fluoroethyl, or fluoropropyl; $Ar^1$ is

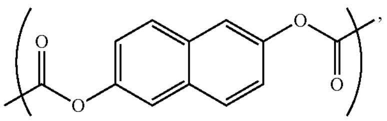

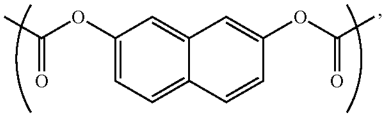

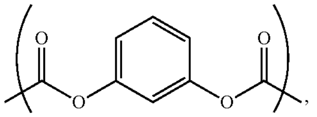

or

-continued

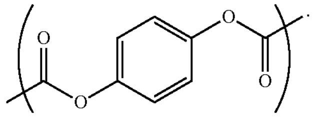

According to embodiments of the disclosure, fluoromethyl group may be monofluoromethyl group, difluoromethyl group or trifluoromethyl group. Fluoroethyl group may be monofluoroethyl group, difluoroethyl group, trifluoroethyl group, tetrafluoroethyl, or perfluoroethyl. Fluoropropyl may be monofluoropropyl, difluoropropyl, trifluoropropyl, tetrafluoropropyl, pentafluoropropyl, hexafluoropropyl, or perfluoropropyl. According to embodiments of the disclosure, propyl group of the disclosure may be n-propyl or isopropyl, and fluoropropyl group may be fluoro-n-propyl, or fluoroisopropyl.

According to embodiments of the disclosure, the first dianhydride may be

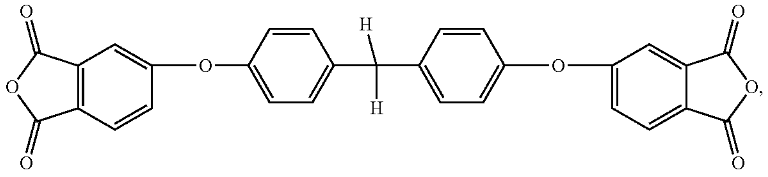

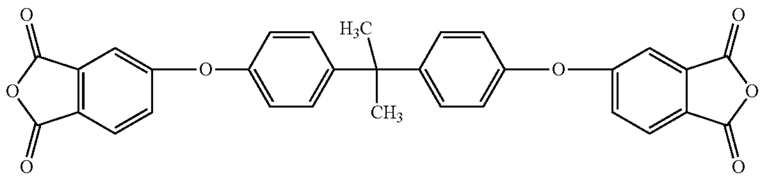

or

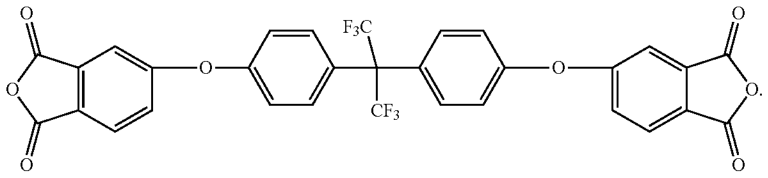

According to embodiments of the disclosure, the first dianhydride may be 2,2-bis[4-(3,4-dicarboxyphenoxy)phenyl] propanedianhydride (BPADA).

According to embodiments of the disclosure, the second dianhydride may be

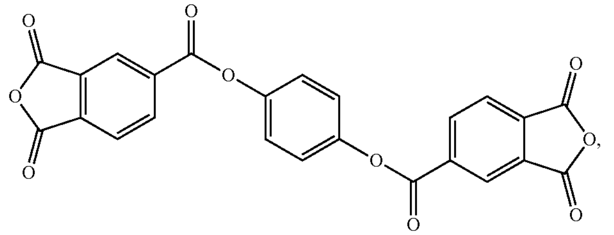

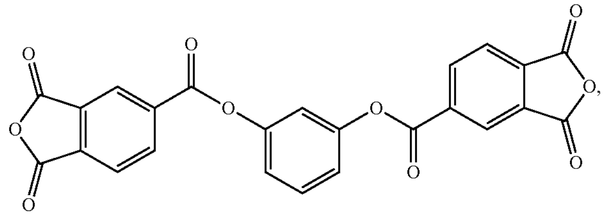

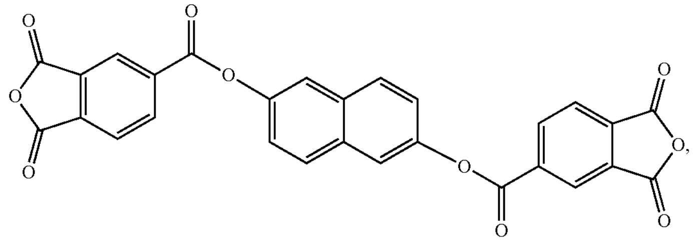

or

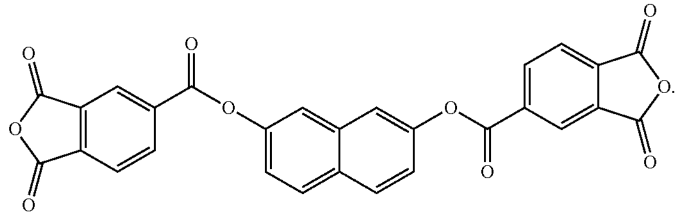

According to embodiments of the disclosure, the second dianhydride may be p-phenylenebis (trimellitate anhydride) (TAHQ), or 2,6-dihydroxynaphthalene bis(trimellitate anhydride) (2,6-TANA).

According to embodiments of the disclosure, the molar ratio of the first dianhydride to the second dianhydride may be 3:7 to 8:2, such as about 4:6, 5:5, 6:4, 7:3 or 7.5:2.5. When the molar ratio of the first dianhydride to the second dianhydride is too high or too low, the film prepared from the composition including the polyimide is apt to cause a directional cracking or exhibits poor dielectric loss factor properties (>0.005 (@10 GHZ)) and high water absorption rate (>1.0%).

According to embodiments of the disclosure, the reactant (b) may include at least one diamine (such as aryl-moiety-containing diamine). According to embodiments of the disclosure, the reactant (b) includes a first diamine. According to embodiments of the disclosure, the first diamine may be

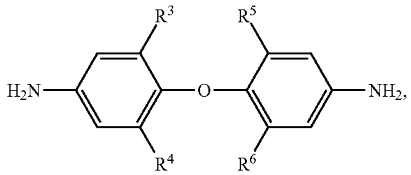

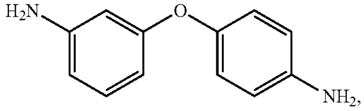

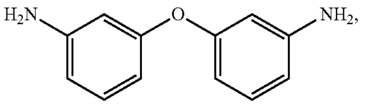

or

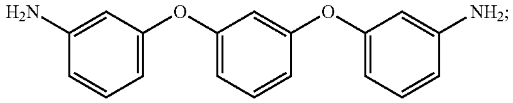

wherein $R^3$, $R^4$, $R^5$ and $R^6$ are independently hydrogen, fluorine, methyl, ethyl, propyl, fluoromethyl, fluoroethyl, or fluoropropyl.

According to embodiments of the disclosure, the reactant (b) is the first diamine. According to embodiments of the disclosure, the first diamine may be

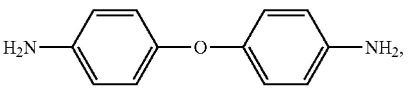

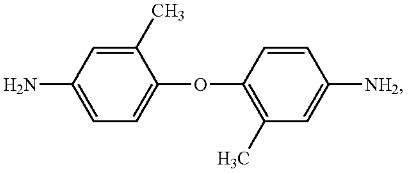

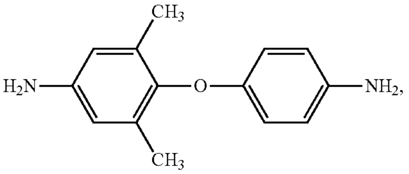

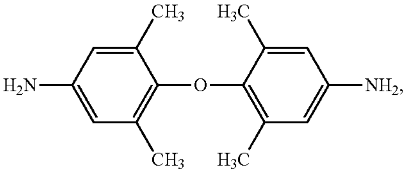

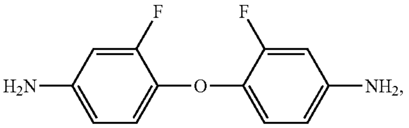

-continued

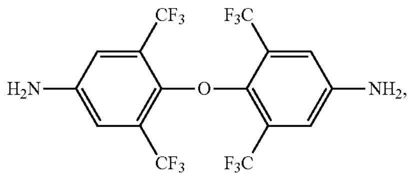

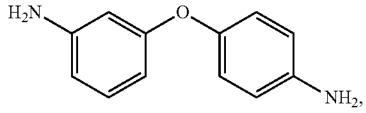

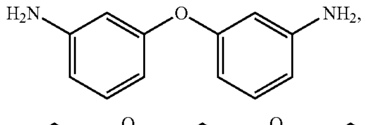

or

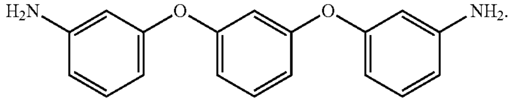

According to embodiments of the disclosure, the first diamine may be 4,4'-Oxybis[3-(trifluoromethyl)aniline] (TMDA), 4,4'-oxydianiline (ODA), or 1,3-bis(3-aminophenoxy) benzene (APB-N).

According to embodiments of the disclosure, the molar ratio of the reactant (a) and the reactant (b) (participated in the reaction (such as polymerization) to form the polyimide) is about 0.95:1.05 to 1.05:0.95, such as about 1:1.

According to embodiments of the disclosure, in addition to the first diamine, the reactant (b) can further include a second diamine, wherein the second diamine is

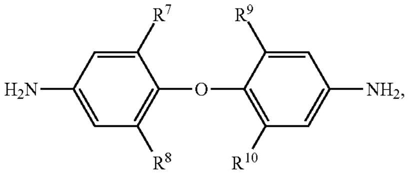

or

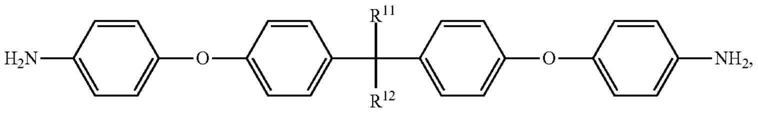

-continued

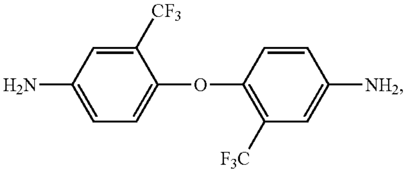

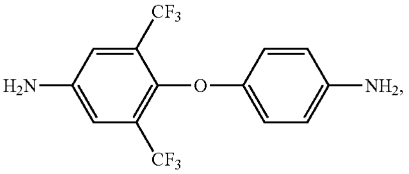

wherein $R^7$, $R^8$, $R^9$, $R^{10}$, $R^{11}$ and $R^{12}$ are independently hydrogen, fluorine, methyl, ethyl, propyl, fluoromethyl, fluoroethyl, or fluoropropyl. In addition, the first diamine is different from the second diamine.

According to embodiments of the disclosure, the second diamine may be

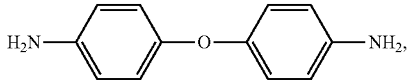

-continued

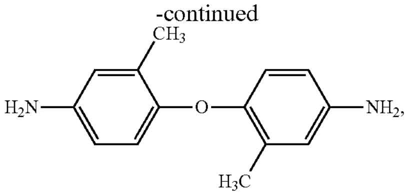
,
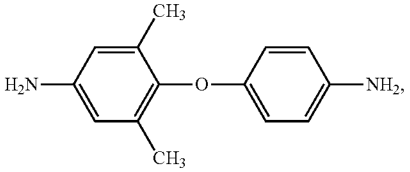
,
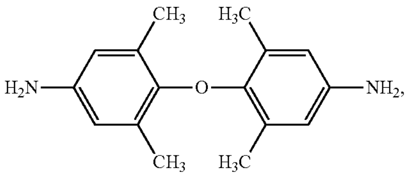
,
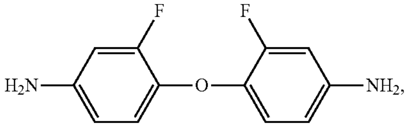
,
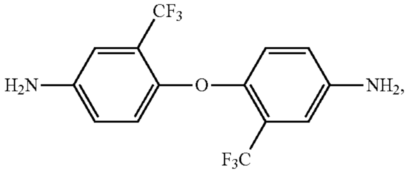
,
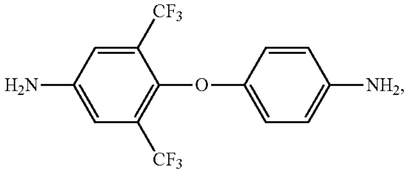
,
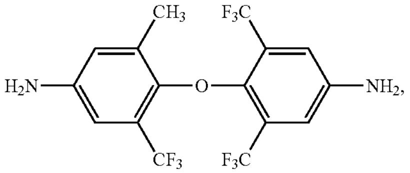
,
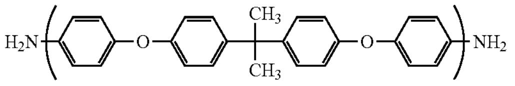
or
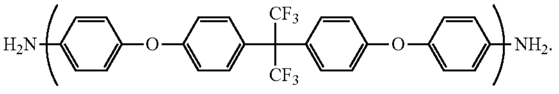
.

According to embodiments of the disclosure, the second diamine may be 2,2-bis [4-(4-aminophenoxy)phenyl] propane (BAPP), 4,4'-oxydianiline (ODA), or 2,2-bis[4-(4-aminophenoxy)phenyl]hexafluoropropane (HFBAPP). According to embodiments of the disclosure, when the first diamine is 4,4'-oxydianiline (ODA), the second diamine is 2,2-bis [4-(4-aminophenoxy)phenyl] propane (BAPP), or 2,2-bis[4-(4-aminophenoxy)phenyl]hexafluoropropane (HFBAPP).

According to embodiments of the disclosure, the reactant (b) may consist of the first diamine and the second diamine. According to embodiments of the disclosure, the molar ratio of the first diamine to the second diamine may be 1:9 to 9:1, such as 2:8, 3:7, 4:6, 5:5, 6:4, 7:3, or 8:2.

According to embodiments of the disclosure, the reactant (b) further comprising a third diamine, wherein the third diamine may be

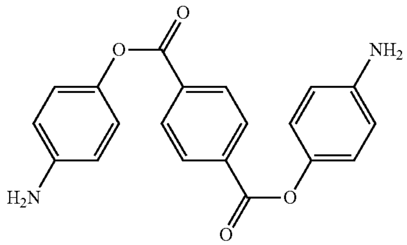
or
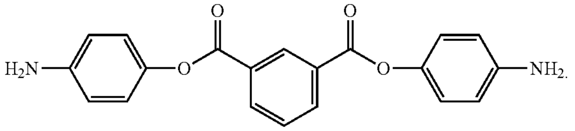
.

According to embodiments of the disclosure, the third diamine may be bis(4-aminophenyl) terephthalate (BPTP).

According to embodiments of the disclosure, the reactant (b) may consist of the first diamine, the second diamine and the third diamine. According to embodiments of the disclosure, the molar ratio of the first diamine to the second diamine may be 1:9 to 9:1 (such as: 2:8, 3:7, 4:6, 5:5, 6:4, 7:3, or 8:2), and the molar ratio of the third diamine to the sum of the first diamine and the second diamine may be about 1:99 to 1:9 (such as about: 2:98, 3:97, 4:96, 5:95, 6:94, 7:93, 8:92, or 9:91).

According to embodiments of the disclosure, the weight average molecular weight (Mw) of the polyimide of the disclosure may be about 5,000 g/mol to 3,000,000 g/mol, such as about 8,000 g/mol to 2,500,000 g/mol, 10,000 g/mol to 2,300,000 g/mol, 15,000 g/mol to 2,000,000 g/mol, 10,000 g/mol to 1,000,000 g/mol, 10,000 g/mol to 500,000 g/mol, or 10,000 g/mol to 300,000 g/mol. The weight average molecular weight (Mw) of the polyimide of the disclosure is determined by gel permeation chromatography (GPC) based on a polystyrene calibration curve.

According to embodiments of the disclosure, the initiator of the disclosure may be photo-initiator. According to embodiments of the disclosure, the initiator may be a benzoin-based compound, acetophenone-based compound, thioxanthone-based compound, ketal compound, benzophenone-based compound, α-aminoacetophenone compound, acylphosphineoxide compound, biimidazole-based compound, triazine-based compound or a combination thereof. The benzoin-based compound may be benzoin, benzoin methyl ether, or benzyl dimethyl ether. The acetophenone-based compound may be p-dimethylamino-acetophenone, α,α'-dimethoxyazoxy-acetophenone, 2,2'-dimethyl-2-phenyl-acetophenone, p-methoxy-acetophenone, 2-methyl-1-(4-methylthiophenyl)-2-morpholino-1-propanone, or 2-benzyl-2-N,N-dimethylamino-1-(4-morpholinophenyl)-1-butanone. The benzophenone-based compound may be benzophenone, 4,4-bis(dimethylamino)benzophenone, 4,4-bis(diethylamino)benzophenone, 2,4,6-trimethylaminobenzophenone, methyl-o-benzoyl benzoate, 3,3-dimethyl-4-methoxybenzophenone or 3,3,4,4-tetra(t-butylperoxycarbonyl)benzophenone. The thioxanthone-based compound may be thioxanthone, 2,4-diethyl-thioxanthanone or thioxanthone-4-sulfone; The biimidazole-based compound may be 2,2'-bis(o-chlorophenyl)-4,4',5,5'-tetraphenyl-biimidazole, 2,2'-bis(o-fluorophenyl)-4,4',5,5'- tetraphenyl-biimidazole, 2,2'-bis(o-methylphenyl)-4,4',5,5'-tetraphenyl-biimidazole, 2,2'-bis(o-methoxyphenyl)-4,4',5,5'-tetraphenyl-biimidazole, 2,2'-bis(o-ethylphenyl)-4,4',5,5'-tetraphenyl-biimidazole, 2,2'-bis(p-methoxyphenyl)-4,4',5,5'-tetraphenyl-biimidazole, 2,2'-bis(2,2',4,4'-tetramethoxyphenyl)-4,4',5,5'-tetraphenyl-biimidazole, 2,2'-bis(2-chlorophenyl)-4,4',5,5'-tetraphenyl-biimidazole, 2,2'-bis(2,4-dichlorophenyl)-4,4',5,5'-tetraphenyl-biimidazole. The acylphosphineoxide compound may be 2,4,6-trimethylbenzoyl diphenylphosphine oxide or bis(2,6-dimethoxy-benzoyl)-2,4,4-trimethylpentylphosphine oxide). The triazine-based compound may be 3-{4-[2,4-bis(trichloromethyl)-s-triazine-6-yl]phenylthio}propionic acid, 1,1,1,3,3,3-hexafluoroisopropyl-3-{4-[2,4-bis(trichloromethyl)-s-triazine-6-yl]phenylthio}propionate, ethyl-2-{4-[2,4-bis (trichloromethyl)-s-triazine-6-yl]phenylthio}acetate, methyl-2-epoxyethyl-2-{4-[2,4-bis(trichloromethyl)-s-triazine-6-yl]phenylthio}acetate, methyl-cyclohexyl-2-{4-[2,4-bis(trichloromethyl)-s-triazine-6-yl]phenylthio}acetate, methyl-benzyl-2-{4-[2,4-bis(trichloromethyl)-s-triazine-6-yl]phenylthio}acetate, 3-{chloro-4-[2,4-bis(trichloromethyl)-s-triazine-6-yl]phenylthio}propionic acid, 3-{4-[2,4-bis(trichloromethyl)-s-triazine-6-yl] phenylthio}propionamide, 2,4-bis(trichloromethyl)-6-p-methoxystyryl-s-triazine, 2,4-bis(trichloromethyl)-6-(1-p-dimethylaminophenyl)-1,3,-butadienyl-s-triazine, or 2-trichloromethyl-4-amino-6-p-methoxystyryl-s-triazine).

According to embodiments of the disclosure, acetophenone-based compound may be the photo-initiator commercially available from Ciba Geigy (with a trade number of Irgacure 2959, Irgacure 184, Irgacure 500, Irgacure 651, Irgacure 369, Irgacure 379, Irgacure 907, or Darocur 1173).

According to embodiments of the disclosure, acylphosphineoxide compound may be the photo-initiator commercially available from Ciba Geigy (with a trade number of Irgacure 819, or Irgacure 1800), and the photo-initiator commercially available from BASF (with a trade number of Lucirin TPO or Lucirin TPO-L).

According to embodiments of the disclosure, the initiator of the disclosure may be the photo-initiator commercially available from LAMBSON (with a trade number of Esacure 1001M, Esacure KIP150, Speedcure BEM, Speedcure EHA, Speedcure BMS, Speedcure MBP, Speedcure PBZ, Speedcure ITX, Speedcure DETX, Speedcure EBD, Speedcure MBB or Speedcure BP), or the photo-initiator commercially available from Ciba Geigy (with a trade number of Irgacure 2100, Irgacure 250, or Irgacure 784).

According to embodiments of the disclosure, the initiator may be an azo compound, cyanovaleric-acid-based compound, peroxide or a combination thereof. The azo compound may be 2,2'-azobis(2,4-dimethyl valeronitrile), dimethyl 2,2'-azobis(2-methylpropionate), 2,2-azobisisobutyronitrile (AIBN), 2,2-azobis(2-methylisobutyronitrile), 1,1'-azobis(cyclohexane-1-carbonitrile), 2,2'-azobis[N-(2-propenyl)-2-methylpropionamide], 1-[(cyano-1-methylethyl)azo] formamide, 2,2'-azobis(N-butyl-2-methylpropionamide), or 2,2'-azobis(N-cyclohexyl-2-methylpropionamide). And, the peroxide may be benzoyl peroxide, 1,1-bis(tert-butylperoxy) cyclohexane, 2,5-bis(tert-butylperoxy)-2,5-dimethylcyclohexane, 2,5-bis(tert-butylperoxy)-2,5-dimethyl-3-cyclohexyne, bis(1-(tert-butylpeorxy)-1-methy-ethyl)benzene, tert-butyl hydroperoxide, tert-butyl peroxide, third tert-butyl peroxybenzoate, cumene hydroperoxide, cyclohexanone peroxide, dicumyl peroxide or lauroyl peroxide.

According to embodiments of the disclosure, the photo-initiator of the disclosure has an absorption wavelength of about 300 nm to 410 nm. According to embodiments of the disclosure, the photo-initiator of the disclosure may be used in concert with a photo-initiator having a main absorption wavelength less than about 300 nm, in order to meet the current UV exposure requirements of commercial I-line and H-line.

According to embodiments of the disclosure, the cross-linking agent of the disclosure may be a compound having at least two crosslinkable functional groups (such as a compound having two crosslinkable functional groups, a compound having three crosslinkable functional groups, a compound having four crosslinkable functional groups, or a compound having five crosslinkable functional groups), wherein the crosslinkable functional group may be C2-5 alkenyl group (such as vinyl group, allyl group, butenyl group, 1,3-butanedienyl group, 1-methyl vinyl group, 1-methyl allyl group, 1,1-dimethyl allyl group, 2-methyl allyl group, 1,2-dimethyl allyl group, methacrylate group, acrylate group, acryloyl group, epoxy group, carboxyl group, or a combination thereof.

According to embodiments of the disclosure, the cross-linking agent may have a number average molecular weight (Mn) less than or equal to 10,000, such as about 50 to 8,000, about 60 to 8,000, about 70 to 6,000, about 80 to 5,000, or about 90 to 3,000.

According to embodiments of the disclosure, the cross-linking agent may include methacrylate-type agent, such as triethylene glycol dimethacrylate (TiEGDMA), ethylene glycol dimethacrylate (EGDMA), tetraethylene glycol dimethacrylate (TTEGDMA), polyethylene glycol (200) dimethacrylate (PEG200DMA), 1,4-butanediol dimethacrylate (BDDMA), diethylene glycol dimethacrylate (DEGDMA), 1,6-hexanediol dimethacrylate (HDDMA), polyethylene glycol (600) dimethacrylate (PEG600DMA), 1,12-dodecanediol dimethacrylate (DDDDMA), 1,3-butylene glycol dimethacrylate (BGDMA), ethoxylated (3) bisphenol A dimethacrylate (BPA3EODMA), ethoxylated (2) bisphenol A dimethacrylate (BPA2EODMA), trimethylolpropane trimethacrylate (TMPTMA), ethoxylated (10) bisphenol A dimethacrylate (BPA10EODMA), ethoxylated (4) bisphenol A dimethacrylate (BPA4EODMA), alkoxylated pentaerythritol tetramethacrylate (PETTMA), polypropylene glycol monomethacrylate (PPGMA) or tricyclodecanedimethanol dimethacrylate (TCDDMDMA).

According to embodiments of the disclosure, the cross-linking agent can include acrylate-type agent, such as dipentaerythritol hexaacrylate (DPHA), 1,6-hexanediol diacrylate (HDDA), polyethylene glycol (200) diacrylate (PEG200DA), tetraethylene glycol diacrylate (TTEGDA), triethylene glycol diacrylate (TIEGDA), pentaerythritol tetraacrylate (PETTA), tripropylene glycol diacrylate (TPGDA), polybutadiene diacrylate (PBDDA), 3-methyl 1,5-pentanediol diacrylate (MPDA), polyethylene glycol (400) diacrylate (PEG400DA), ethoxylated 3 bisphenol A diacrylate (BPA3EODA), trimethylolpropane triacrylate (TMPTA), di-trimethylolpropane tetraacrylate (Di-TMPTTA), tris (2-hydroxyethyl) isocyanurate triacrylate (THEICTA), dipentaerythritol pentaacrylate (DPPA), ethoxylated (20) trimethylolpropane triacrylate (TMP20EOTA), pentaerythritol triacrylate (PETIA), ethoxylated (3) trimethylolpropane triacrylate (TMP3EOTA), propoxylated (3) trimethylolpropane triacrylate (TMP3POTA), ethoxylated (4) pentaerythritol tetraacrylate, ethoxylated (6) trimethylolpropane triacrylate (TMP6EOTA), ethoxylated (9) trimethylolpropane triacrylate (TMP9EOTA), dipropylene glycol diacrylate (DPGDA), 1,10 decanediol diacrylate (DDDA), ethoxylated (4) bisphenol A diacrylate (BPA4EODA), ethoxylated (10) bisphenol A diacrylate (BPA10E0DA), esterdiol diacrylate (EDDA), polyethylene glycol (600) diacrylate (PEG600DA), alkoxylated diacrylate, tricyclodecanedimethanol diacrylate (TCDDMDA), propoxylated (2) neopentyl glycol diacrylate (PONPGDA), propoxylated (3) glyceryl triacrylate (GPTA), ethoxylated (15) trimethylolpropane triacrylate (TMP15EOTA), or ethoxylated (12) glyceryl triacrylate (G12EOTA).

According to embodiments of the disclosure, the cross-linking agent can include allylic type agent, such as triallyl cyanurate (TAC), triallyl isocyanurate (TAIC), triallylphosphate (TAP), triallyl borate (TAB), trimethallyl isocyanurate (TMAIC), diallylterephthalate (DATP), diallyl carbonate, diallyl maleate, diallyl fumarate, diallyl phosphite, trimethylolpropane diallyl ether, or 1,1,2,2-tetraallyloxyethane.

According to embodiments of the disclosure, the cross-linking agent can include vinylic type agent, such as bis (vinylphenyl)ethane (BVPE), bis (4-vinylphenyl) methane, 1,4-butadiene, divinylacetylene, divinylbenzene (DVB), divinyl ether, divinyl sulfide, divinyl sulfone, divinyl sulfoxide, 1,3-divinylcyclohexane, 1,3-divinylcyclopentane, 1,5-hexadiene, isoprene, or 1,2,4-trivinyl cyclohexane (TVCH).

According to embodiments of the disclosure, the cross-linking agent of the disclosure may be commercially available, such as Dianal NR series cross-linking agent (commercially available from Mitsubishi Rayon Co., Ltd.), cross-linking agent with a trade number of Photomer 6173 (commercially available from Diamond Shamrock Co., Ltd.), cross-linking agent with a trade number of Viscoat R-264 (commercially available from Osaka Organic Chemical Industry Ltd.), cross-linking agent with a trade number of KS Resist 106 (commercially available from Osaka Organic Chemical Industry Ltd.), CYCLOMER P series cross-linking agent (commercially available from Daicel Corporation), PLACCEL CF200 series cross-linking agent (commercially available from Daicel Corporation), Ebecryl series cross-linking agent (commercially available from Daicel UCB Co., Ltd.), cross-linking agent with a trade number of Acrycure RD-F8 (commercially available from Nippon Shokubai Co., Ltd.), VISIOMER series cross-linking agent (commercially available from Evonik Performance Materials GmbH), BECKOPDX series cross-linking agent (commercially available from Cytec Industries), CRYLCOAT series cross-linking agent (commercially available from Cytec Industries Inc.), SETAL series cross-linking agent (commercially available from Nuplex resins), ANCAMIDE series cross-linking agent (commercially available from Air Products, Inc.), or a combination thereof.

According to embodiments of the disclosure, the photosensitive composition can further include a solvent, in order to dissolve the ingredients of the photosensitive composition. Therefore, the ingredients of the photosensitive composition may be dispersed in the solvent. According to embodiments of the disclosure, the solvent may be benzene, toluene, xylene, ethylbenzene, diethylbenzene, trimethylbenzene, triethylbenzene, cyclohexane, cyclohexene, decahydronaphthalene, dipentene, pentane, hexane, heptane, octane, nonane, decane, ethyl cyclohexane, methyl cyclohexane, p-menthane, dipropyl ether, dibutyl ether, anisole, butyl acetate, pentyl acetate, methyl isobutyl ketone, cyclohexylbenzene, cyclohexanone, cyclopentanone (CPN), triglyme, 1,3-dimethyl-2-imidazolidinone (DMI), N-methyl-2-pyrrolidone (NMP), methyl ethyl ketone (MEK), N,N-dimethylacetamide (DMAc), γ-butyrolactone (GBL), N,N-Dimethylformamide (DMF), propylene glycol methyl ether acetate (PGMEA), dimethyl sulfoxide (DMSO), or a combination thereof. According to embodiments of the disclosure, the photosensitive composition has a solid content of 20 wt % to 40 wt % (such as about 21 wt %, 22 wt %, 25 wt %, 27 wt %, 29 wt %, 30 wt %, 32 wt %, 34 wt %, 35 wt %, or 38 wt %). Herein, the solid content means a weight percentage of the ingredients of the photosensitive composition except the solvent, based on the total weight of the photosensitive composition.

The thickness of the film prepared from the photosensitive composition is related to the solid content of the photosensitive composition. In other words, the thickness of the film prepared from the photosensitive composition can be adjusted by the solid content of the photosensitive composition.

According to embodiments of the disclosure, the photosensitive composition of the disclosure substantially consists of the polyimide of the disclosure, initiator, crosslinking agent and solvent. Namely, the polyimide, initiator, cross-linking agent and solvent are the main ingredients of the photosensitive composition. The photosensitive composition may further include other minor ingredients. According to embodiments of the disclosure, the minor ingredient may be the catalyst for preparing polyimide, the residual reactant (a) and/or reactant (b), an additive, or a combination thereof. When the photosensitive composition includes other minor ingredients, the amount of minor ingredients may be 0.01 parts by weight to 20 parts by weight. According to embodiments of the disclosure, the additive may be known by those skilled in the art additive, such as filler, flame retardant, viscosity modifier, thixotropic agent, defoamer, colorant, leveling agent, surface treatment agent, stabilizer, antioxidant or a combination thereof. According to other embodiments of the disclosure, the photosensitive composition of the disclosure may consist of the main ingredients and the minor ingredient. According to another embodiment of the disclosure, in addition to the polyimide prepared from the reactant (a) and reactant (b), the photosensitive composition of the disclosure may include other polyimide, and the amount of the other polyimide is less than or equal to 80 parts by weight. According to another embodiment of the disclosure, in addition to the polyimide prepared from the reactant (a) and reactant (b), the photosensitive composition of the disclosure does not include other polyimide, so that the photosensitive composition can form a film at low temperature and the cured product of the photosensitive composition exhibits low dielectric coefficient (Dk) and low dielectric loss factor (Df) at high frequency (such as more than 10 GHz)

According to embodiments of the disclosure, the disclosure also provides a film, wherein the film is a cured product of the photosensitive composition of the disclosure via photolithography process and baking process.

According to embodiments of the disclosure, the film of the disclosure may be prepared by the following steps. First, a coating of the photosensitive composition of the disclosure is formed on the substrate via a coating process. According to embodiments of the disclosure, the coating process may be screen printing, spin coating, bar coating, blade coating, roller coating, dip coating, spray coating, or brush coating. According to embodiments of the disclosure, the substrate may be metal foil (such as copper foil), silicon substrate, glass, and any desired layer may be formed on the substrate at first. Next, the coating is subjected to a pre-baking process (with a process temperature of about 60° C. to 120° C., and there is the option to adjust the process time by several seconds to several minutes). Next, the substrate is exposed through a mask by an irradiation, wherein the irradiation may be X-ray, electron beam, UV ray, visible ray, or any photo source suitable for being used as an irradiation source. After exposure, the coating on the substrate is subsequently developed with a developer to remove the unexposed portion of the coating, obtaining a patterned layer. Finally, the patterned layer is subjected to a baking process (with a process temperature of about 120° C. to 200° C. Optionally, the process time can be adjusted by several seconds to several hours). Developing can be accomplished by immersion, spraying, or another known developing methods. The patterned layer is subsequently washed with deionized water. According to embodiments of the disclosure, the developer may be alkaline aqueous developer, such as inorganic base (such as potassium hydroxide, sodium hydroxide, sodium hydrogen carbonate, or sodium carbonate), primary amine (such as ethylamine), secondary amine (such as diethylamine), tertiary amine (such as triethylamine), or quaternary ammonium salt (such as tetramethylammonium hydroxide (TMAH)).

Since the photosensitive composition of the disclosure has the specific polyimide of the disclosure, the photosensitive composition can be baked at a relatively low temperature (i.e. the photosensitive composition has a lower filming temperature (of about 160° C. to 200° C.)) to obtain the film. In addition, the layer (i.e. the cured product of photosensitive composition) formed via lithography process exhibits superior resolution, electrical properties, chemical resistance and thermal tolerance. In addition, the obtained cured layer exhibits low dielectric coefficient (Dk) (such as less than or equal to 2.81) and low dielectric loss factor (Df) (such as less than or equal to 0.0097) at high frequency (more than 10 GHz) and meets the requirement of patterned insulating material used in advanced 5G high frequency system.

Below, exemplary embodiments will be described in detail with reference to the accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

EXAMPLE

Table 1 lists the reagents involved in the Examples and Comparative Examples of the disclosure.

TABLE 1

| abbreviation | name | structure |
|---|---|---|
| BPADA | 2,2-bis[4-(3,4-dicarboxy-phenoxy)phenyl]propane-dianhydride | 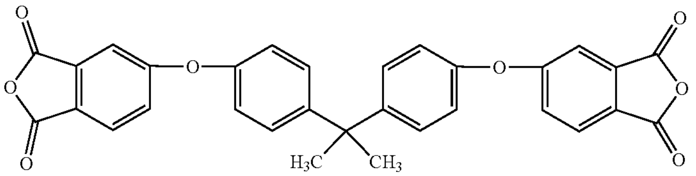 [SMILES: CC(C)(c1ccc(Oc2ccc3c(c2)C(=O)OC3=O)cc1)c1ccc(Oc2ccc3c(c2)C(=O)OC3=O)cc1] |
| TAHQ | p-phenylene-bis (trimellitate anhydride) | 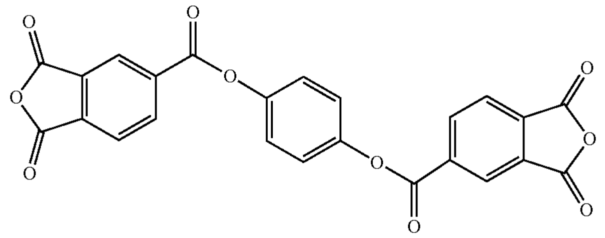 [SMILES: O=C(Oc1ccc(OC(=O)c2ccc3c(c2)C(=O)OC3=O)cc1)c1ccc2c(c1)C(=O)OC2=O] |
| 2,6-TANA | 2,6-dihydroxy-naphthalene bis(trimellitate anhydride) | 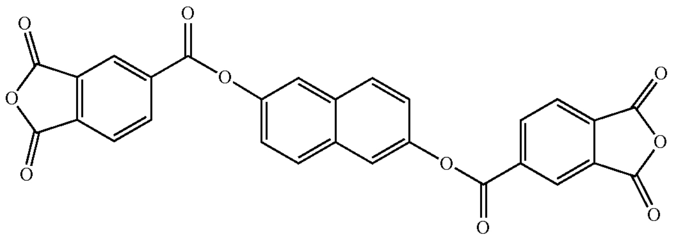 [SMILES: O=C(Oc1ccc2cc(OC(=O)c3ccc4c(c3)C(=O)OC4=O)ccc2c1)c1ccc2c(c1)C(=O)OC2=O] |
| BPDA | 3,3,4,4-biphenyl tetracarboylic dianhydride | 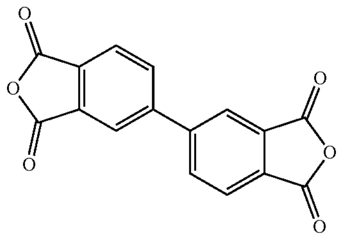 [SMILES: O=C1OC(=O)c2cc(-c3ccc4c(c3)C(=O)OC4=O)ccc21] |

TABLE 1-continued

| | | |
|---|---|---|
| ODA | 4,4'-oxydi-aniline | 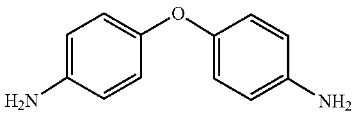 [SMILES: Nc1ccc(Oc2ccc(N)cc2)cc1] |
| BPTP | bis(4-amino-phenyl) terephthalate | 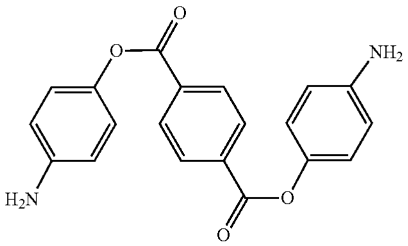 [SMILES: Nc1ccc(OC(=O)c2ccc(C(=O)Oc3ccc(N)cc3)cc2)cc1] |
| APB-N | 1,3-bis(3-aminophenoxy) benzene | 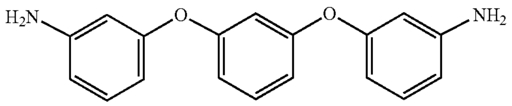 [SMILES: Nc1cccc(Oc2cccc(Oc3cccc(N)c3)c2)c1] |
| TMDA | 4,4'-Oxybis[3-(trifluoroMethyl) aniline] | 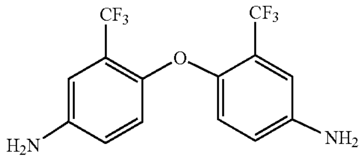 [SMILES: Nc1ccc(Oc2ccc(N)cc2C(F)(F)F)c(C(F)(F)F)c1] |
| BAPP | 2,2-bis [4-(4-aminophenoxy)-phenyl]propane | 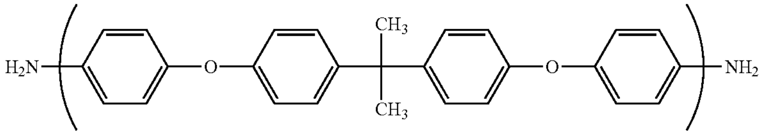 |
| HFBAPP | 2,2-bis[4-(4-aminophenoxy)-phenyl]hexa-fluoropropane | 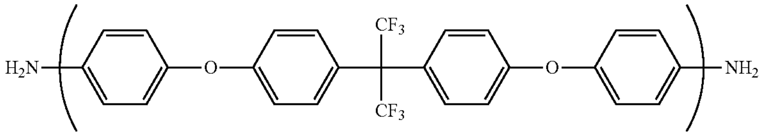 |
| BAHF | 2,2-bis(3-amino-4-hydroxyphen-yl)hexafluoro-propane | 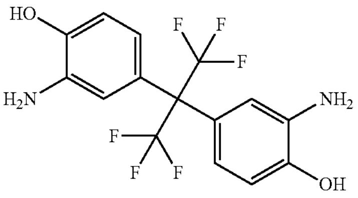 [SMILES: Nc1cc(C(c2ccc(O)c(N)c2)(C(F)(F)F)C(F)(F)F)ccc1O] |

| abbreviation | name | use |
|---|---|---|
| | isoquinoline | catalyst |
| NMP | N-methyl-pyrrolidinone | solvent |
| DMAC | dimethyl acetamide | solvent |
| GBL | gamma-butyrol-actone | solvent |
| Irgacure 907 | 2-methyl-[4-(methylthio) phenyl]-2-morpholino-1-propanon | initiator |
| Irgacure 184 | 1-hydroxy-cyclohexyl-phenyl-ketone | initiator |
| DPHA | dipentaery-thritol hexa-acrylate | crosslinking agent |

Preparation of Polyimide

Preparation Example 1

2,2-bis[4-(3,4-dicarboxyphenoxy)phenyl]propanedianhydride (BPADA) (75 parts by mole), p-phenylenebis (trimellitate anhydride) (TAHQ) (25 parts by mole), 4,4'-Oxybis [3-(trifluoroMethyl)aniline] (TMDA) (32 parts by mole), 2,2-bis [4-(4-aminophenoxy)phenyl] propane (BAPP) (40 parts by mole), and bis(4-aminophenyl) terephthalate (BPTP) (8 parts by mole) were added into a reaction bottle and then dissolved in gamma-butyrolactone (GBL), obtaining a solution (with a solid content of about 35 wt %). Next, isoquinoline (serving as a catalyst with an amount of about 0.3 wt %, based on the total weight of BPADA, TAHQ, TMDA, BAPP and BPTP) was added into the reaction bottle. After reacting the result at 180° C. for 6 hours, 4,4'-Oxybis[3-(trifluoroMethyl)aniline] (TMDA) (8 parts by mole), 2,2-bis [4-(4-aminophenoxy)phenyl] propane (BAPP) (10 parts by mole) and bis(4-aminophenyl) terephthalate (BPTP) (2 parts by mole) were added into the reaction bottle. After reacting the result at 90° C. for 3 hours, xylene was added into the reaction bottle, obtaining Polyimide-containing solution (1) (with a solid content of about 30 wt %).

Preparation Example 2

Preparation Example 2 was performed in the same manner as in Preparation Example 1, except that the amount of 2,2-bis[4-(3,4-dicarboxyphenoxy)phenyl]propanedianhydride (BPADA) was incearsed from 75 parts by mole to 80 parts by mole, and the amount of p-phenylenebis (trimellitate anhydride) (TAHQ) was reduced form 25 parts by mole to 20 parts by mole, obtaining Polyimide-containing solution (2).

Preparation Example 3

Preparation Example 3 was performed in the same manner as in Preparation Example 1, except that the amount of 2,2-bis[4-(3,4-dicarboxyphenoxy)phenyl]propanedianhydride (BPADA) was reduced form 75 parts by mole to 70 parts by mole, and the amount of p-phenylenebis (trimellitate anhydride) (TAHQ) was incearsed from 25 parts by mole to 30 parts by mole, obtaining Polyimide-containing solution (3).

Comparative Preparation Example 1

Comparative Preparation Example 1 was performed in the same manner as in Preparation Example 1, except that the amount of 2,2-bis[4-(3,4-dicarboxyphenoxy)phenyl]propanedianhydride (BPADA) was incearsed from 75 parts by mole to 90 parts by mole, and the amount of p-phenylenebis (trimellitate anhydride) (TAHQ) was reduced from 25 parts by mole to 10 parts by mole, obtaining Polyimide-containing solution (4).

Comparative Preparation Example 2

3,3,4,4-biphenyl tetracarboylic dianhydride (BPDA) (100 parts by mole), 2,2-bis [4-(4-aminophenoxy)phenyl] propane (BAPP) (48 parts by mole), and 2,2-bis(3-amino-4-hydroxyphenyl)hexafluoropropane (BAHF) (32 parts by mole) were added into a reaction bottle and then dissolved in gamma-butyrolactone (GBL), obtaining a solution (with a solid content of about 35 wt %). Next, isoquinoline (serving as a catalyst with an amount of about 0.3 wt %, based on the total weight of BPDA, BAPP and BAHF) was added into the reaction bottle. After reacting the result at 180° C. for 6 hours, 2,2-bis [4-(4-aminophenoxy)phenyl] propane (BAPP) (12 parts by mole), and 2,2-bis(3-amino-4-hydroxyphenyl)hexafluoropropane (BAHF) (8 parts by mole) were added into the reaction bottle. After reacting the result at 90° C. for 3 hours, xylene was added into the reaction bottle, obtaining Polyimide-containing solution (5) (with a solid content of about 30 wt %).

Table 2 lists the dianhydrides and diamines involved in the Preparation Examples 1-3 and Comparative Examples 1 and 2 of the disclosure.

TABLE 2

| | BPADA (parts by mole) | TAHQ (parts by mole) | TMDA (parts by mole) | BAPP (parts by mole) | BPTP (parts by mole) |
|---|---|---|---|---|---|
| Preparation Example 1 | 75 | 25 | 40 | 50 | 10 |
| Preparation Example 2 | 80 | 20 | 40 | 50 | 10 |
| Preparation Example 3 | 70 | 30 | 40 | 50 | 10 |
| Comparative Preparation Example 1 | 90 | 10 | 40 | 50 | 10 |
| | BPDA (parts by mole) | BAPP (parts by mole) | BAHF (parts by mole) | — | — |
| Comparative Preparation Example 2 | 100 | 60 | 40 | — | — |

Preparation of Photosensitive Composition

Example 1

19.6 parts by weight of photo-initiator (commercially available from Ciba Geigy with a trade number of Irgacure 907), 17.65 parts by weight of photo-initiator (commercially available from Ciba Geigy with a trade number of Irgacure 184), and 58.8 parts by weight of crosslinking agent (dipentaerythritol hexaacrylate, DPHA) were dissolved in Polyimide-containing solution (1) of Preparation Example 1 (the solid content thereof was 100 parts by weight), obtaining Photosensitive composition (1).

Example 2

Example 2 was performed in the same manner as in Example 1, except that Polyimide-containing solution (1) of Preparation Example 1 was replaced with Polyimide-containing solution (2) of Preparation Example 2, obtaining Photosensitive composition (2).

Example 3

Example 3 was performed in the same manner as in Example 1, except that Polyimide-containing solution (1) of Preparation Example 1 was replaced with Polyimide-containing solution (3) of Preparation Example 3, obtaining Photosensitive composition (3).

Comparative Example 1

Comparative Example 1 was performed in the same manner as in Example 1, except that Polyimide-containing solution (1) of Preparation Example 1 was replaced with Polyimide-containing solution (4) of Comparative Preparation Example 1, obtaining Photosensitive composition (4).

Example 4

0.37 parts by weight of photo-initiator (commercially available from Ciba Geigy with a trade number of Irgacure 907), 0.61 parts by weight of photo-initiator (commercially available from Ciba Geigy with a trade number of Irgacure 184), and 21.12 parts by weight of crosslinking agent (dipentaerythritol hexaacrylate, DPHA) were dissolved in Polyimide-containing solution (2) of Preparation Example 2 (the solid content thereof was 100 parts by weight), obtaining Photosensitive composition (5).

Example 5

0.25 parts by weight of photo-initiator (commercially available from Ciba Geigy with a trade number of Irgacure 907), 0.99 parts by weight of photo-initiator (commercially available from Ciba Geigy with a trade number of Irgacure 184), and 22.37 parts by weight of crosslinking agent (dipentaerythritol hexaacrylate, DPHA) were dissolved in Polyimide-containing solution (2) of Preparation Example 2 (the solid content thereof was 100 parts by weight), obtaining Photosensitive composition (6).

Comparative Example 2

Comparative Example 2 was performed in the same manner as in Example 4, except that Polyimide-containing solution (2) of Preparation Example 2 was replaced with Polyimide-containing solution (5) of Comparative Preparation Example 2, obtaining Photosensitive composition (7).

Comparative Example 3

Comparative Example 3 was performed in the same manner as in Example 5, except that Polyimide-containing solution (2) of Preparation Example 2 was replaced with Polyimide-containing solution (5) of Comparative Preparation Example 2, obtaining Photosensitive composition (8).

Example 6

0.37 parts by weight of photo-initiator (commercially available from Ciba Geigy with a trade number of Irgacure 907), 0.74 parts by weight of photo-initiator (commercially available from Ciba Geigy with a trade number of Irgacure 184), and 21.9 parts by weight of crosslinking agent (dipentaerythritol hexaacrylate, DPHA) were dissolved in Polyimide-containing solution (2) of Preparation Example 2 (the solid content thereof was 100 parts by weight), obtaining Photosensitive composition (9).

Example 7

0.89 parts by weight of photo-initiator (commercially available from Ciba Geigy with a trade number of Irgacure 907), 0.38 parts by weight of photo-initiator (commercially available from Ciba Geigy with a trade number of Irgacure 184), and 25.6 parts by weight of crosslinking agent (dipentaerythritol hexaacrylate, DPHA) were dissolved in Polyimide-containing solution (2) of Preparation Example 2 (the solid content thereof was 100 parts by weight), obtaining Photosensitive composition (10).

Properties Measurement of Photosensitive Composition

Photosensitive compositions (1)-(4) were subjected to photolithography process. The photolithography process includes following steps. Photosensitive compositions (1)-(4) were coated on a substrate, and then subjected to a pre-baking process at 110° C. for 2 minutes, obtaining a film. Next, the film was irradiated by digital lithography technology (DLT) (with a wavelength of 405 nm and an energy density of 800 mj/cm$^2$). Next, the film was developed in the developer (Microposit MF-319, commercially available from Rohm and Hass Electronic Materials LLC) for 60 seconds and then washed with propylene glycol methyl ether acetate (PGMEA) for 30 seconds. The layer of the coating after photolithography process was observed to determine whether a patterned layer was obtained. When the layer was developed to form a patterned layer, it was marked with ○. When the product could not be developed to form a patterned layer, it was marked with X. Next, the layer was baked at 160° C., obtaining a cured product. Next, the dielectric coefficient (Dk), dielectric loss factor (Df) of the cured product, thickness, light transmittance, and b* value of the cured product of Photosensitive compositions (1)-(4) were measured, and the results are shown in Table 3. The dielectric coefficient (Dk) and dielectric loss factor (Df) were measured at a frequency of 10 GHz using a microwave dielectrometer (available from AET Corporation). The thickness was measured by optical microscopy. The light transmittance was measured by a visible light with a wavelength of 550 nm. The b* value was calculated based on the equation described in JIS Z 8730 (2009).

TABLE 3

| | whether a patterned layer was obtained | thickness (nm) | light transmittance (%) | b* | Dk@ 10 GHz | Df@ 10 GHz |
|---|---|---|---|---|---|---|
| Example 1 | ○ | 49 | 81.57 | 42.6 | 2.54 | 0.0092 |
| Example 2 | ○ | 38 | 84.42 | 39.7 | 2.53 | 0.0082 |
| Example 3 | ○ | 45 | 87.27 | 7.01 | 2.63 | 0.0086 |
| Comparative Example 1 | X (no film was formed) | 48 | 86.68 | 14.17 | 2.46 | 0.0088 |

As shown in Table 3, in Comparative Example 1, since the molar ratio of the BPADA (the first dianhydride) to TAHQ (the second dianhydride) was 1:9, Photosensitive composition (4) of Comparative Example 1 was unable to form a film. In addition, Photosensitive compositions (1)-(3) of Examples 1-3 could be baked at a lower temperature (such as about 160° C.). This means that the photosensitive composition of the disclosure indeed has a lower filming temperature. In addition, the film of Photosensitive compositions (1)-(3) of Examples 1-3 prepared by photolithography process exhibits low dielectric coefficient (Dk) (less than 2.65) and low dielectric loss factor (Df) (less than or equal to 0.0092) at high frequency (more than 10 GHz).

Next, Photosensitive compositions (5)-(8) were subjected to photolithography process, and the filming temperature of result was measured and the result was subjected to a resolution test. The photolithography process includes following steps. Photosensitive compositions (5)-(8) were coated on a substrate, and then subjected to a pre-baking process at 110° C. for 2 minutes, obtaining a film. Next, the film was irradiated by broadband UV source (with a wavelength of 250-405 nm and an energy density of 500 mj/cm2). Next, the film was developed by tetramethylammonium hydroxide (TMAH) aqueous solution (having a weight percentage of 2.38 wt %) for 60 seconds and then washed with propylene glycol methyl ether acetate (PGMEA) for 30 seconds. Next, the result was baked at a temperature within a range of 160° C. to 250° C., and the lowest filming temperature was recorded, obtaining a cured product. The results of the resolution tests are represented by the minimum line widths/line spaces of the patterns of the cured product after being developed and dried, and the results are shown in Table 4. Next, the dielectric coefficient (Dk) and dielectric loss factor (Df) of the cured product of Photosensitive compositions (5)-(8) were measured and the results are shown in Table 4.

TABLE 4

| | filming temperature (° C.) | L/S Resolution (μm) | Dk@ 10 GHz | Df@ 10 GHz |
|---|---|---|---|---|
| Example 4 | 160 | 20/20 | 2.544 | 0.0093 |
| Example 5 | 160 | 10/10 | 2.50 | 0.0084 |
| Comparative Example 2 | 220 | 20/20 | 2.544 | 0.020 |
| Comparative Example 3 | 220 | 10/10 | 2.50 | 0.017 |

As shown in Table 4, since the dianhydride and diamine for preparing the polyimide of Comparative Examples 2 and 3 were not the specific dianhydride and diamine disclosed in the disclosure, Photosensitive compositions (7) and (8) exhibited higher filming temperature (greater than 200° C.), and the film of Photosensitive compositions (7) and (8) after photolithography process exhibited higher dielectric loss factor (Df) (greater than 0.015) at high frequency (more than 10 GHz). In addition, Photosensitive compositions (5) and (6) of Examples 4 and 5 could be baked at lower temperature (about 160° C.), and this means that the photosensitive composition of the disclosure has a lower filming temperature. Furthermore, the film of Photosensitive compositions (5) and (6) of Examples 4 and 5 prepared by photolithography process exhibits low dielectric coefficient (Dk) (less than 2.55) and low dielectric loss factor (Df) (less than or equal to 0.0093) at high frequency (more than 10 GHz).

Next, Photosensitive compositions (9) and (10) were subjected to photolithography process, and the filming temperature of result was measured and the result was subjected to a resolution test. The photolithography process includes following steps. Photosensitive compositions (9) and (10) were coated on a substrate, and then subjected to a pre-baking process at 110° C. for 2 minutes, obtaining a film. Next, the film was irradiated by digital lithography technology (DLT) (with a wavelength of 405 nm and an energy density of 800 mj/cm2). Next, the film was developed by (tetramethylammonium hydroxide (TMAH) aqueous solution (having a weight percentage of 2.38 wt %) for 60 seconds and then washed with propylene glycol methyl ether acetate (PGMEA) for 30 seconds. Next, the result was baked at 160° C., obtaining a cured product. The results of the resolution tests are represented by the minimum line widths/line spaces of the patterns of the cured product after being developed and dried, and the results are shown in Table 5. Next, the dielectric coefficient (Dk) and dielectric loss factor (Df) of the cured product of Photosensitive compositions (9) and (10) were measured and the results are shown in Table 5.

TABLE 5

| | filming temperature (° C.) | L/S Resolution (μm) | Dk@ 10 GHz | Df@ 10 GHz |
|---|---|---|---|---|
| Example 6 | 160 | 5/5 | 2.806 | 0.0097 |
| Example 7 | 160 | 2/2 | 2.777 | 0.0085 |

As shown in Table 5, Photosensitive compositions (9) and (10) of Examples 6 and 7 could be baked at lower temperature (about 160° C.), and this means that the photosensitive composition of the disclosure indeed has a lower filming temperature. Furthermore, the film of Photosensitive compositions (9) and (10) of Examples 6 and 7 prepared by photolithography process exhibits low dielectric coefficient (Dk) (less than 2.81) and low dielectric loss factor (Df) (less than or equal to 0.0097) at high frequency (more than 10 GHz).

It will be clear that various modifications and variations can be made to the disclosed methods and materials. It is intended that the specification and examples be considered as exemplary only, with the true scope of the disclosure being indicated by the following claims and their equivalents.

What is claimed is:

1. A photosensitive composition, comprising:

100 parts by weight of polyimide;

0.25-50 parts by weight of initiator; and 0.25-100 parts by weight of crosslinking agent, wherein the polyimide is a product of a reactant (a) and a reactant (b) via a reaction, wherein the reactant (a) consists of a first dianhydride and a second dianhydride, wherein the molar ratio of the first dianhydride to the second dianhydride is 6:4 to 8:2, wherein the first dianhydride is

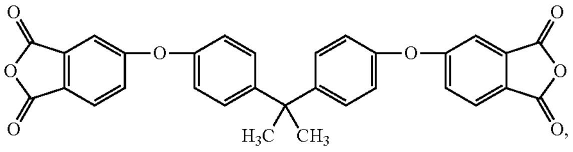 [SMILES: CC(C)(c1ccc(Oc2ccc3c(c2)C(=O)OC3=O)cc1)c1ccc(Oc2ccc3c(c2)C(=O)OC3=O)cc1]

and the second dianhydride is

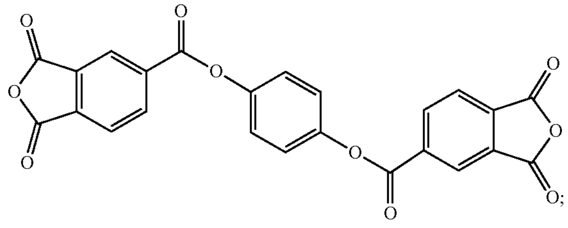 [SMILES: O=C(Oc1ccc(OC(=O)c2ccc3c(c2)C(=O)OC3=O)cc1)c1ccc2c(c1)C(=O)OC2=O]

and, the reactant (b) consists of a first diamine, a second diamine and a third diamine, wherein the first diamine is

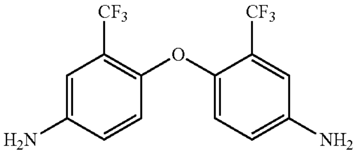 [SMILES: Nc1ccc(Oc2ccc(N)cc2C(F)(F)F)c(C(F)(F)F)c1]

the second diamine is

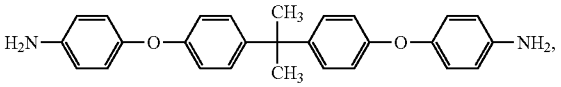 [SMILES: CC(C)(c1ccc(Oc2ccc(N)cc2)cc1)c1ccc(Oc2ccc(N)cc2)cc1]

and the third diamine is

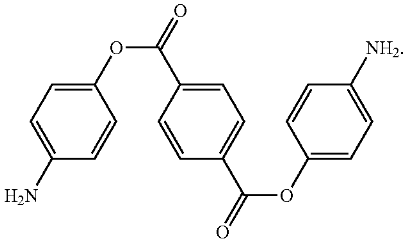 [SMILES: Nc1ccc(OC(=O)c2ccc(C(=O)Oc3ccc(N)cc3)cc2)cc1]

2. The photosensitive composition as claimed in claim 1, wherein the molar ratio of the first diamine to the second diamine is 1:9 to 9:1.

3. The photosensitive composition as claimed in claim 1, wherein the molar ratio of the third diamine to a sum of the first diamine and the second diamine is 1:99 to 1:9.

4. The photosensitive composition as claimed in claim 1, wherein a weight average molecular weight of the polyimide is 5,000 to 3,000,000 g/mol.

5. The photosensitive composition as claimed in claim 1, wherein the initiator is benzoin-based compound, acetophenone-based compound, thioxanthone-based compound, ketal compound, benzophenone-based compound, α-amino-acetophenone compound, acylphosphineoxide compound, biimidazole-based compound, triazine-based compound, azo compound, cyanovaleric-acid-based compound, peroxide, or a combination thereof.

6. The photosensitive composition as claimed in claim 1, wherein the crosslinking agent is a compound having at least two crosslinkable functional groups, wherein the crosslinkable functional group is $C_{2-5}$ alkenyl group, methacrylate group, acrylate group, acryloyl group, epoxy group or carboxyl group.

7. The photosensitive composition as claimed in claim 1, further comprising a solvent, wherein the photosensitive composition has a solid content of 20 wt % to 40 wt %.

8. The photosensitive composition as claimed in claim 7, wherein the solvent is benzene, toluene, xylene, ethylbenzene, diethylbenzene, trimethylbenzene, triethylbenzene, cyclohexane, cyclohexene, decahydronaphthalene, dipentene, pentane, hexane, heptane, octane, nonane, decane, ethyl cyclohexane, methyl cyclohexane, p-menthane, dipropyl ether, dibutyl ether, anisole, butyl acetate, pentyl acetate, methyl isobutyl ketone, cyclohexylbenzene, cyclohexanone, cyclopentanone (CPN), triglyme, 1,3-dimethyl-2-imidazolidinone (DMI), N-methyl-2-pyrrolidone (NMP), methyl ethyl ketone (MEK), N,N-dimethylacetamide (DMAc), γ-butyrolactone (GBL), N,N-Dimethylformamide (DMF), propylene glycol methyl ether acetate (PGMEA), dimethyl sulfoxide (DMSO), or a combination thereof.

9. A film, which is a cured product of the photosensitive composition as claimed in claim 1.

* * * * *